United States Patent [19]

Ling et al.

[11] 4,227,940
[45] Oct. 14, 1980

[54] SOLAR CELL FOR USE IN CONCENTRATOR

[75] Inventors: Ku Sun Ling, Glendora; Seksan Khemthong, Whittier, both of Calif.

[73] Assignee: Optical Coating Laboratory, Inc., Santa Rosa, Calif.

[21] Appl. No.: 935,526

[22] Filed: Aug. 21, 1978

[51] Int. Cl.² ............................................. H01L 31/06
[52] U.S. Cl. .................................................... 136/256
[58] Field of Search ............ 136/89 CC, 89 P, 89 SG, 136/89 CA, 89 GA

[56] References Cited

U.S. PATENT DOCUMENTS

| | | | |
|---|---|---|---|
| 3,340,096 | 9/1967 | Mann et al. | 136/89 |
| 3,811,954 | 5/1974 | Lindmayer | 136/89 |
| 3,966,499 | 6/1976 | Yasui et al. | 136/206 |
| 4,084,985 | 4/1978 | Evans, Jr. | 136/89 P |
| 4,116,718 | 9/1978 | Yerkes et al. | 136/89 PC |

OTHER PUBLICATIONS

"OCLI N/P Silicon Terrestrial Solar Cells–Part No. 60-1045", Product Literature, Optical Coating Laboratory, Inc., (1978).
E. L. Burgess et al., "Performance of n+p Silicon Solar Cells in Concentrated Sunlight", *IEEE Trans. Electron Dev.*, vol. Ed-24, pp. 433–438, (1977).

*Primary Examiner*—Aaron Weisstuch
*Attorney, Agent, or Firm*—Flehr, Hohbach, Test, Albritton & Herbert

[57] ABSTRACT

Solar cell for use in a concentrator having a body formed essentially of silicon doped with a P-type impurity and having a base resistivity ranging from 0.5 to 1.5 ohm-centimeter and having back and front side planar surfaces. A layer of aluminum is formed on the back side surface and is alloyed into the silicon body to form a P-plus layer extending through the back side surface. An N+ layer is formed in the silicon body and extends through the front side surface. A multi-layer metal contact structure is secured by the backside and makes a P-type contact. A multi-layer metal contact structure is carried by the front side surface and makes an N-type contact. The multi-layer contact structure carried by the front side surface is formed into a grid line pattern with the grid line pattern being characterized by first and second common bus bars extending substantially through 360° on said surface and being spaced at different distances from the center of the front side surfaces.

5 Claims, 6 Drawing Figures

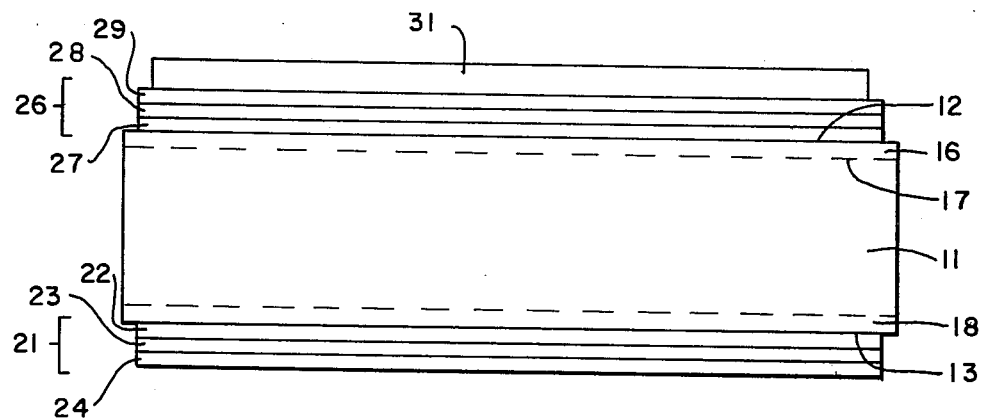
FIG.—1
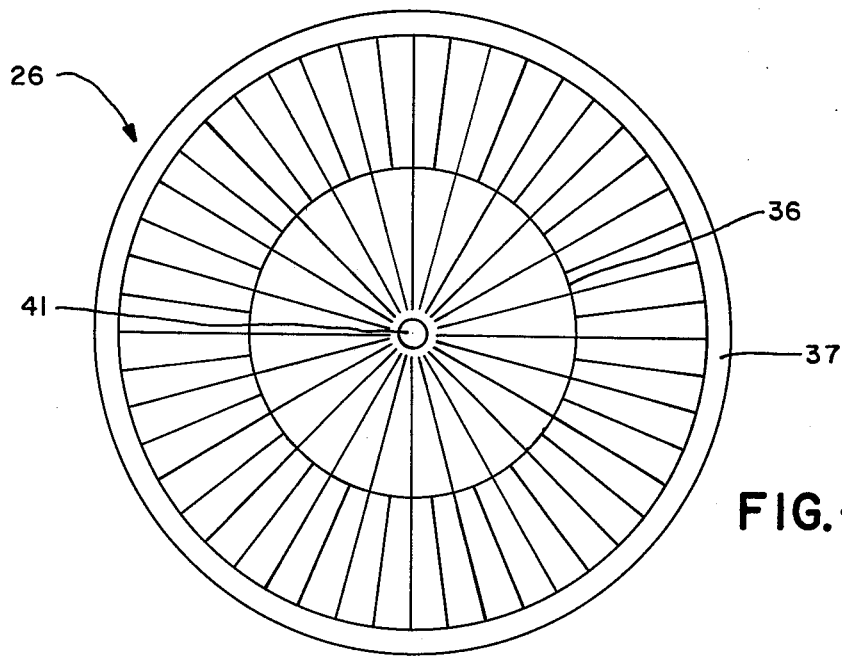
FIG.—2
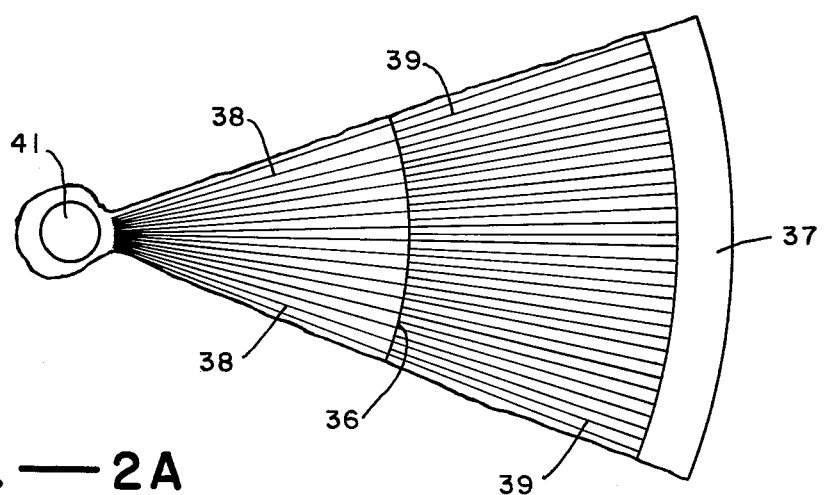
FIG.—2A

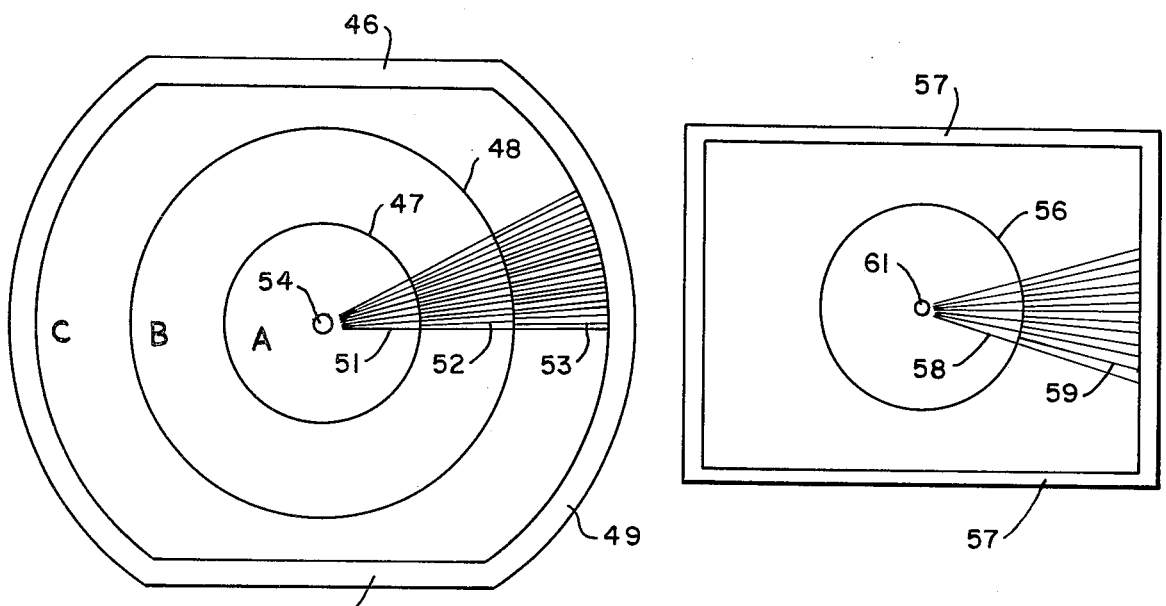
FIG.—3
FIG.—4
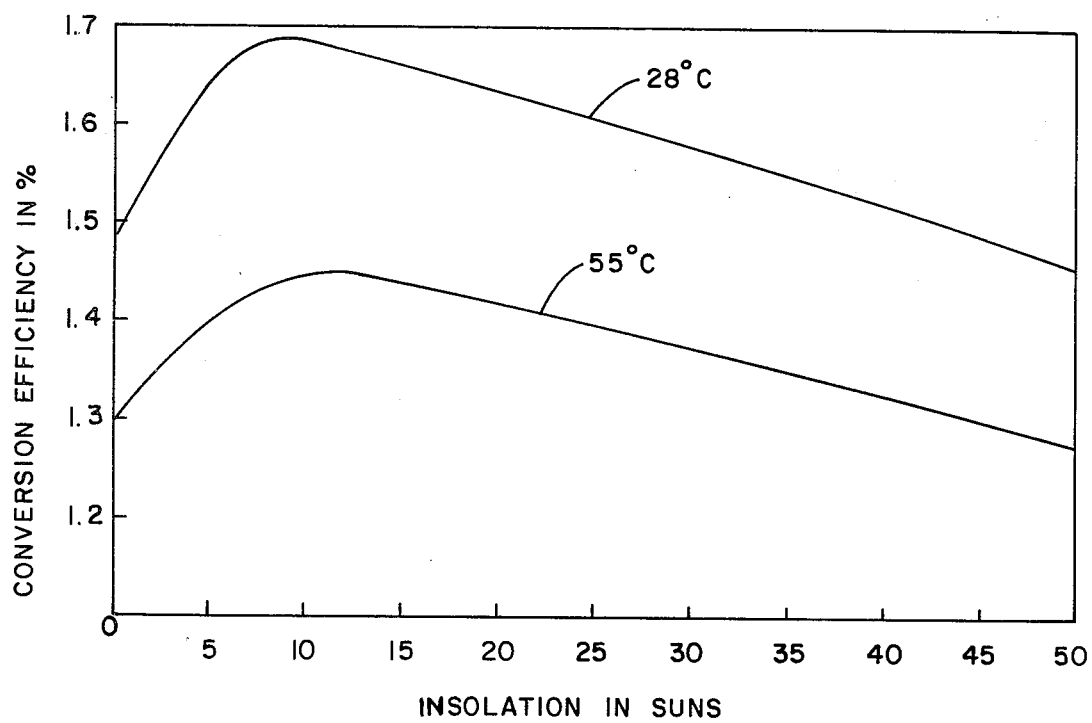
FIG.—5

4,227,940

SOLAR CELL FOR USE IN CONCENTRATOR

BACKGROUND OF THE INVENTION

In an article entitled "Silicon Solar Cell Development for Concentrated-Sunlight, High-Temperature Applications" by J. G. Fossum and E. L. Burgess, published in the Twelfth I.E.E.E. Photo-Voltaic Specialist Conference held in 1976, there are disclosed theoretical design concepts and data on experimental designs which were fabricated. These designs were verified through computer controlled testing of the cell at various solar illuminations. In re-examining these solar cells, it has been found that they have certain deficiencies. For example, their efficiency is less than desired. In addition, deficiencies have been found in the grid patterns which were utilized, particularly in that in certain surface areas the grid lines became so concentrated that the exposed active area was too greatly reduced. There is therefore need for an improved silicon solar cell for use in a concentrator.

SUMMARY OF THE INVENTION

The silicon solar cell for use in a concentrator is designed with a grid pattern which has at least two buses that are spaced apart different distances from the center of the solar cell which makes it possible to provide radial grid lines which are less concentrated at the center so that there is more active area exposed to increase the efficiency of the solar cell. The bulk silicon utilized has a base resistivity ranging from 0.5 to 1.5 ohm-centimeter which also provides greater efficiency.

In general, it is an object of the present invention to provide a solar cell for use in the concentrator which has substantially improved efficiency.

Another object of the invention is to provide a solar cell of the above character which has a substantially improved efficiency at lower insolation.

Another object of the invention is to provide a solar cell of the above character which has a base resistivity ranging from 0.5 to 1.5 ohm-centimeter.

Another object of the invention is to provide a solar cell which is adapted for operation under high intensity insolation from 10 to 100 times that of sunlight.

Another object of the invention is to provide a solar cell of a character in which the series resistance has been substantially reduced.

Another object of the invention is to provide a solar cell of the above character in which redundant paths are provided for currents to be collected by the contact structure.

Another object of the invention is to provide a radial multi-grid pattern in which two or more conducting paths are provided extending through substantially 360°.

Another object of the invention is to provide solar cell of the above character in which the electrical performance of the solar cell is not substantially impaired by breaks in the grid lines.

Another object of the invention is to provide a solar cell of the above character which can be produced with higher yields and lower manufacturing costs per cell.

Another object of the invention is to provide a solar cell of the above character which has a low series resistance and provides a high electrical output.

Additional features and objects of the invention will appear from the following description in the preferred embodiments set forth in detail in conjunction with the accompanying drawing.

DESCRIPTION OF THE DRAWING

FIG. 1 is a cross-sectional view of a solar cell incorporating the present invention.

FIG. 2 is a planar view of the solar cell incorporating the present invention and utilizing circular geometry.

FIG. 2A is a enlarged portion of the view shown in FIG. 2.

FIG. 3 is a plan view of another embodiment of the solar cell incorporating the present invention showing the use of flats on two opposite sides.

FIG. 4 is a plan view of still another embodiment of the present invention which has a generally rectangular outer geometry.

FIG. 5 is a graph showing the efficiency of a solar cell incorporating the present invention operating at 28° C. and 55° C. and showing the conversion efficiency in percent.

DESCRIPTION OF THE PREFERRED EMBODIMENT

In FIG. 1 there is shown a cross-sectional view of the construction which is utilized in the solar cell of the present invention. As shown in FIG. 1, it consists of a substrate or body 11 formed essentially of a generally circular wafer of silicon and doped with a suitable P-type impurity to provide a base of resistivity ranging from 0.5 1.5 ohm-centimeter and preferably approximately 1 ohm-centimeter. The body 11 is provided with front and back generally planar surfaces 12 and 13. A layer (not shown) of aluminum is evaporated onto the rear planar surface 13. A suitable N-type impurity such as phosphorous is then diffused through the front surface 12 to a suitable depth, as for example 0.3 microns, to form an N plus region 16 which extends down from the surface 12 to a PN junction 17. At the same time that this diffusion is taking place, the aluminum which has been deposited upon the back surface 13 is alloyed into the body 11 to form a P+ region 18 which extends inwardly from the surface 13.

A multi-layer contact structure 21 is formed on the rear planar surface 13 and consists of three layers 22, 23 and 24 with the first layer 22 counting from the body 11 and being formed of titanium, the second layer 23 being formed of palladium and the third layer 24 being formed of silver. This multi-layer contact structure is of a conventional type and is deposited to conventional thicknesses.

Thereafter, a photoresist layer (not shown) deposited on the front surface 12 is exposed to a particular pattern and then developed to provide a pattern of exposed areas of the type hereinafter described. Thereafter, a multi-layer contact structure 26 is deposited over the photoresist and onto the surface 12 where exposed by the pattern formed in the photoresist to make contact with the front planar surface 12. The multi-layer contact structure consists of three layers 27, 28 and 29 with the first layer 27 counting from the substrate or body 11 being formed of titanium, the second layer 28 being formed of palladium and the third layer 29 being formed of silver. This multi-layer contact structure 26 is also of a conventional type and is formed to conventional thicknesses. A lift-off process is then utilized to remove the unwanted metal so there remains on the surface 12 a multi-layer contact structure in the form of the pattern through which the photoresist was exposed. After the lift-off process has been completed, the silver 29 can be increased in thickness as for example 4 to 6 microns. This multi-layer contact structure 26 makes contact to the N-plus region 16. Thereafter, a multi-layer anti-reflection coating 31 is deposited upon the multi-layer contact structure 26 and is of the type described in U.S. Pat. No. 4,055,442.

The type of construction hereinbefore described in conjunction with FIG. 1 is the type of construction utilized in the solar cells of the present invention. One type of solar cell used in the present invention is shown in FIG. 2 which shows a planar view of the same and the pattern utilized for the contact structure 26. As shown, the contact structure is in the form of a radial multi-grid pattern. This pattern consists of at least two, identified as first and second, common buses which are spaced apart from the center of the pattern or center of the solar cell and which extend through substantially 360°. As shown, these common buses in FIG. 2 take the form of two contact rings 36 and 37 with contact ring 36 being generally of equal distance from the center and the outer margin of the solar cell and the contact ring or annular bus 37 being disposed on the outer margin of the solar cell. A plurality of spaced apart radially extending tapered grid lines 38 and 39 are provided with the grid line 38 extending from near the center of the solar cell through the contact ring or bus 36 to the outer contact ring 37 whereas the spaced apart grid lines 39 extend from the contact bus 36 to the contact bus 37. As can be seen, grid lines 38 are relatively long whereas grid lines 39 are substantially shorter. As also can be seen from the pattern, alternate grid lines are longer and the other grid lines are shorter and are alternately disposed between the longer grid lines. The grid lines 38 and 39 can have any desired dimensions. However, in order to reduce the series resistance of the solar cell to as low as possible, the width of the grid lines should also be kept to a minimum so that the active area to which light can impinge upon is not severely reduced. It should, however, be appreciated that the finer the grid line the easier it is for the grid lines to have breaks or discontinuities. However, when this occurs with the present invention, only a portion of this will be lost because this additional contact bus provides a redundant path for current flow.

By way of example, a solar cell constructed in accordance with the present invention had a diameter of 2.230 inches. The inner margin of the outer bus 37 had a diameter of 2.05 inches. The inner contact bus had a diameter of 1.150 inches. The center area 41 had a diameter of 0.10 inches. This center area was covered with the same materials making the contact structure 26. By doing this there is some small sacrifice in efficiency with a higher sheet resistance and which shorted out the central area to provide a more efficient solar cell.

The grid lines 38 and 39 can be of suitable dimensions. By way of example, in the embodiment shown in FIG. 2, the grid lines 38 consisted of 150 lines equally spaced at 2° and 24 minutes and were 0.950 inches in length. The grid lines 39 also consisted of 150 lines equally spaced at 2° and 24 minutes and had a length of 0.450 inches. The spacing between each of the grid lines was 1° and 12 minutes typically. With respect to the longer grid lines 38, the tip had the dimension range from 0.0015 0.0025 whereas the outer extremity had a dimension ranging from 0.0015 to 0.0017. The shorter grid lines 39 had a tip dimension of 0.008 to 0.009 and the outer extremity had a dimension of 0.0015 to 0.0017.

Another pattern is shown in FIG. 3 utilizing the same principle which was disclosed in FIG. 2. However, in this case, the solar cell is provided with two flats 46 to facilitate the mounting of the solar cells. In the pattern shown in FIG. 3 there are provided three annular buses 47, 48 and 49 rather than the two annular buses 36 and 37 provided in FIG. 2. The outer annular bus 49 is positioned adjacent the outer perimeter of the solar cell shown in FIG. 3 and thus is disposed along straight lines along the flats 46. Grid lines 51, 52 and 53 are provided. In an embodiment of the solar cells shown in FIG. 3, the solar cell had grid lines extending into area A which had a length of 1.285 inches with the inner extremity having a dimension of 0.005 to 0.007 and the outer extremity having a dimension of 0.0023 to 0.0025. For the grid lines 52 extending into area B, the grid lines had a length of 0.430 inches, had an inner tip dimension of 0.0010 to 0.0012 and an outer dimension of 0.0016 to 0.0018. The grid lines 53 extending into area C had a length of 0.430 inches and had an inner tip dimension of 0.0016 to 0.0018 and an outer grid dimension of 0.0023 to 0.0025. The grid lines 51 consists of 90 lines equally spaced at 4° apart. The grid lines 52 consist of 180 lines spaced at 2° apart and the grid lines 53 consist of 270 lines equally spaced at 1° and 20 minutes apart. The solar cell was provided with a center 54 having a diameter of 0.10 inches.

Another embodiment of the solar cell is shown in FIG. 4 and is of a rectangular type. It is provided with an inner contact bus 56 and an outer contact bus 57 which extends around the perimeter of the solar cell. Grid lines 58 and 59 are provided in the same manner as the grid lines hereinbefore described were provided. A center 61 is also provided.

A graph showing the results obtained from a solar cell of the type hereinbefore described is shown in FIG. 5. Two curves 66 and 67 are shown therein in which one curve is for a temperature at 28° C. and the other is for a temperature of 55° C. The cells tested had an active area of 21.3 cm². The ordinate is calibrated in efficiency in percent whereas the abscissa is in insolation in suns from 0 to 50 suns. From the curve 66 for 28° C. it can be seen that the efficiency of the solar cell peaked at approximately 9 suns with an efficiency of approximately 16.7% and at 50 suns it had an efficiency of approximately 15.05%. At 55° C., the curve 67 shows that the efficiency peaks at approximately 11 suns with an efficiency of 14.5%. At 50 suns it has an efficiency of 12.7%. The curves show that substantially increased efficiency can be obtained with the solar cells of the present invention. It is believed that the peaking of the present solar cells at lower suns is because of the use of a higher base resistivity. The construction herein provided makes possible a solar cell with low series resistance which results in a high electrical output. The grid pattern utilized provides redundant paths for current flow which in the event of breaks in the grid lines does not substantially impair the electrical performance of the cell. This also makes it possible to obtain higher yields at lower manufacturing costs.

What is claimed is:

1. In a solar cell for use in a concentrator, comprising a generally circular wafer formed essentially of silicon having a base resistivity ranging from 0.5 to 1.5 ohm-centimeter and having back and front surfaces, the wafer having a diameter of approximately 2 inches, a layer of aluminum formed on the back surface and alloyed into the silicon wafer to form a P+ layer extending through the back surface, an N+ formed in the wafer and extending through the front surface, a multi-layer metal contact structure carried by the back surface making contact to the P+ layer, a multi-layer contact structure carried by the front surface and making contact to the N+ region, said multi-layer contact structure carried by the front surface being formed with a grid line pattern, the grid line pattern being characterized by first and second spaced apart buses extending through substantially 360° and approximately 300 closely spaced radially extending tapered grid lines, said grid lines being tapered in a direction so that they become narrower in the direction towards the center of said cell, approximately 150 of said grid lines commencing in areas beyond the first and second buses and crossing over the first bus in a direction away from the center of the solar cell toward the outer extremity of the solar cell and being in contact with the first and second buses and approximately 150 of the remaining grid lines commencing at the first bus and extending to the second bus and being in contact with the first and second buses.

2. A solar cell as in claim 1 wherein the second bus extends along the outer perimeter of the solar cell and the first named grid lines extend from substantially the center of the cell to the outer bus and the other grid lines extend from the inner bus to the outer bus.

3. A solar cell as in claim 1 wherein the central portion of the solar cell on the front surface is covered with a metal.

4. In a solar cell for use in a concentrator, comprising a generally circular wafer having a pair of flats disposed on opposite sides and formed essentially of silicon having a base resistivity ranging from 0.5 to 1.5 ohm-centimeter and having back and front surfaces, the wafer having a diameter of approximately 2 inches, a layer of aluminum formed on the back surface and alloyed into the silicon wafer to form a P+ layer extending through the back surface, an N+ layer formed in the wafer and extending through the front surface, a multi-layer metal contact structure carried by the back surface making contact to the P+ layer, a multi-layer contact structure carried by the front surface and making contact to the N+ region, said multi-layer contact structure carried by the front surface being formed with a grid line pattern, the grid line pattern being characterized by first, second, and third spaced apart buses extending through approximately 360° and approximately 270 closely spaced radially extending tapered grid lines, said grid lines being tapered in a direction so that they narrow in a direction towards the center of said cell, approximately 90 of said grid lines commencing in areas beyond the first, second and third buses and crossing over the first bus in a direction away from the center of the solar cell towards the outer extremity of the solar cell and being in contact with the first, second and third buses, approximately 180 of said grid lines commencing in areas beyond the second and third buses and crossing over the second bus in a direction away from the center of the solar cell toward the outer extremity of the solar cell and being in contact with the first and second buses, approximately 90 of the remaining grid lines commencing in areas beyond the third bus and crossing over the third bus in a direction away from the center of the solar cell towards the outer extremity of the solar cell and being in contact with the third bus.

5. A solar cell as in claim 4 wherein the central portion of the solar cell on the front surface is covered with a metal.

* * * * *